(12) United States Patent
Matsumoto et al.

(10) Patent No.: US 10,749,500 B2
(45) Date of Patent: Aug. 18, 2020

(54) HIGH-FREQUENCY MODULE

(71) Applicant: Murata Manufacturing Co., Ltd., Nagaokakyo-shi, Kyoto-fu (JP)

(72) Inventors: Naoya Matsumoto, Nagaokakyo (JP); Syuichi Onodera, Nagaokakyo (JP); Kouichi Ueno, Nagaokakyo (JP); Shinya Mizoguchi, Nagaokakyo (JP); Masahide Takebe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 14 days.

(21) Appl. No.: 15/997,779

(22) Filed: Jun. 5, 2018

(65) Prior Publication Data
US 2018/0287582 A1    Oct. 4, 2018

Related U.S. Application Data

(63) Continuation of application No. PCT/JP2016/087318, filed on Dec. 14, 2016.

(30) Foreign Application Priority Data

Dec. 25, 2015  (JP) .................................. 2015-255445

(51) Int. Cl.
*H03H 9/72* (2006.01)
*H03H 9/64* (2006.01)
(Continued)

(52) U.S. Cl.
CPC .............. *H03H 9/725* (2013.01); *H03H 7/46* (2013.01); *H03H 9/02535* (2013.01);
(Continued)

(58) Field of Classification Search
CPC ...... H03H 7/46; H03H 9/0571; H03H 9/0557; H03H 9/02535; H03H 9/706;
(Continued)

(56) References Cited

U.S. PATENT DOCUMENTS

| 2002/0000895 A1* | 1/2002 | Takahashi ............ H03H 9/0576 333/133 |
| 2011/0193650 A1 | 8/2011 | Takenoshita et al. |

(Continued)

FOREIGN PATENT DOCUMENTS

| JP | 07-249923 A | 9/1995 |
| JP | 09-307306 A | 11/1997 |

(Continued)

OTHER PUBLICATIONS

Official Communication issued in International Patent Application No. PCT/JP2016/087318, dated Mar. 7, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A high-frequency module that performs filtering of signals transmitted and received through an antenna includes an antenna terminal, a transmission terminal, a reception terminal, a reception filter connected between the antenna terminal and the reception terminal, a transmission filter connected between the antenna terminal and the transmission terminal, a first element connected between the antenna terminal and the transmission filter, and a second element connected in series between the transmission terminal and the transmission filter. The first element and the second element are capacitively coupled to each other.

18 Claims, 10 Drawing Sheets

(51) Int. Cl.
  H03H 9/05     (2006.01)
  H04B 1/525    (2015.01)
  H04B 1/38     (2015.01)
  H04B 1/18     (2006.01)
  H03H 7/46     (2006.01)
  H03H 9/25     (2006.01)
  H03H 9/02     (2006.01)
  H03H 9/70     (2006.01)

(52) U.S. Cl.
  CPC ........ *H03H 9/0557* (2013.01); *H03H 9/0571* (2013.01); *H03H 9/25* (2013.01); *H03H 9/6423* (2013.01); *H03H 9/6483* (2013.01); *H03H 9/6489* (2013.01); *H03H 9/706* (2013.01); *H04B 1/18* (2013.01); *H04B 1/38* (2013.01); *H04B 1/525* (2013.01)

(58) Field of Classification Search
  CPC ........ H03H 9/6483; H03H 9/725; H03H 9/25; H03H 9/6423; H03H 9/6489; H04B 1/18; H04B 1/525; H04B 1/38

USPC .................. 333/133, 187, 188, 193–196
  See application file for complete search history.

(56) References Cited

U.S. PATENT DOCUMENTS

| | | | |
|---|---|---|---|
| 2013/0057361 A1* | 3/2013 | Sakano | H01L 23/3121 333/193 |
| 2014/0010122 A1 | 1/2014 | Krems et al. | |
| 2015/0042417 A1 | 2/2015 | Onodera et al. | |
| 2015/0137909 A1 | 5/2015 | Okuda et al. | |
| 2016/0156335 A1 | 6/2016 | Takeuchi | |

FOREIGN PATENT DOCUMENTS

| | | |
|---|---|---|
| JP | 2006-229871 A | 8/2006 |
| JP | 2013-048491 A | 3/2013 |
| JP | 2014-501467 A | 1/2014 |
| JP | 2015-033080 A | 2/2015 |
| WO | 2010/013778 A1 | 2/2010 |
| WO | 2014/034373 A1 | 3/2014 |
| WO | 2015/019794 A1 | 2/2015 |

* cited by examiner

HIGH-FREQUENCY MODULE

This application claims the benefit of priority to Japanese Patent Application No. 2015-255445 filed on Dec. 25, 2015 and is a Continuation Application of PCT Application No. PCT/JP2016/087318 filed on Dec. 14, 2016. The entire contents of each application are hereby incorporated herein by reference.

BACKGROUND OF THE INVENTION

1. Field of the Invention

The present invention relates to a high-frequency module that performs filtering of signals transmitted and received through an antenna.

2. Description of the Related Art

The level of requirement specifications for high-frequency modules such as duplexers and which include transmission filters and reception filters has increased in recent years in response to widespread use of wireless devices such as cellular phones and various technologies have been developed (for example, refer to Japanese Unexamined Patent Application Publication No. 2014-501467).

Japanese Unexamined Patent Application Publication No. 2014-501467 discloses a reactance filter in which a cutoff band is suppressed and which includes an input terminal through which an input signal is applied, an output terminal through which an output signal is output, at least one series resonator connected to a signal line between the input terminal and the output terminal, a parallel resonator connected between the signal line and a terminal through which reference potential is applied, and an inductor connected in series to the parallel resonator. The reactance filter is characterized in that a capacitor is connected between at least one parallel resonator and the inductor with a terminal and is connected to the output terminal with another terminal. With such a reactance filter, connection of the circuit of the reactance filter as a transmission filter with a duplexer device enables isolation in a reception band of the duplexer device to be improved. This is because, since another signal path on which the input terminal and the output terminal of the transmission filter are capacitively coupled to each other is formed in parallel with a signal path of the transmission filter, adjusting the amplitude and the phase of a signal propagated on the other signal path enables a leak signal from the transmission filter to be cancelled. The isolation means isolation between the transmission filter and the reception filter in the high-frequency module and specifically means suppression in the reception band of the leak signal from the transmission filter.

However, the filter disclosed in Japanese Unexamined Patent Application Publication No. 2014-501467 has a problem in that, since a capacitance is connected between a node between the parallel resonator and the inductor and the output terminal when the filter is applied to the transmission filter in the high-frequency module, such as a duplexer, the value of the inductor connected in series to the parallel resonator is limited due to improvements in isolation characteristics, although the isolation characteristics are improved, and it is difficult to control an attenuation pole. The attenuation pole means a point (frequency position) at which a specific frequency is locally attenuated (suppressed) in frequency characteristics.

SUMMARY OF THE INVENTION

Preferred embodiments of the present invention provide high-frequency modules that each include a transmission filter and a reception filter and that is capable of improving the isolation and easily controlling the attenuation pole.

A high-frequency module according to a preferred embodiment of the present invention includes an antenna terminal; a transmission terminal; a reception terminal; a reception filter connected between the antenna terminal and the reception terminal; a transmission filter connected between the antenna terminal and the transmission terminal; a first element connected between the antenna terminal and the transmission filter; and a second element connected in series between the transmission terminal and the transmission filter. The first element and the second element are capacitively coupled to each other.

With this configuration, since the first element connected between the antenna terminal and the transmission filter is capacitively coupled to the second element connected in series between the transmission terminal and the transmission filter, a leak signal from the transmission filter is cancelled to improve isolation. Since the second element is not an inductor connected in series to parallel resonators, but instead is an element connected in series between the transmission terminal and the transmission filter, the value of the second element is hardly limited due to the improvement of isolation characteristics. In other words, adjusting the value of the inductor connected in series to the parallel resonators in the transmission filter enables an attenuation pole to be controlled with little influence on the isolation. Accordingly, the high-frequency module is obtained, which includes the transmission filter and the reception filter and which is capable of improving the isolation and easily controlling the attenuation pole.

In a high-frequency module according to a preferred embodiment of the present invention, the first element is at least one of a line with which the antenna terminal is connected to the transmission filter, a first inductor connected between a node between the antenna terminal and the transmission filter and ground, a line connected to the first inductor, a first capacitor connected between the node and the ground, and a line connected to the first capacitor. The second element is at least one of a line with which the transmission terminal is connected to the transmission filter, a second inductor connected between the transmission terminal and the transmission filter, a line connected to the second inductor, a second capacitor connected between the transmission terminal and the transmission filter, and a line connected to the second capacitor.

With this configuration, at least one of the line, the inductor, and the capacitor is capable of being selected and used as each of the first element and the second element that are capacitively coupled to each other.

In a high-frequency module according to a preferred embodiment of the present invention, the first element is a line with which the first inductor is connected to the ground and the second element is the second inductor.

With this configuration, selecting the line with which the first inductor is connected to the ground as the first element and selecting the second inductor as the second element enable the first element and the second element to be easily provided using the wiring pattern. Accordingly, it is possible to easily provide the high-frequency module capable of improving the isolation and easily controlling the attenuation pole.

A high-frequency module according to a preferred embodiment of the present invention further include a substrate on which the reception filter and the transmission filter are mounted, a conductor pattern is provided on the substrate, and the first element and the second element are capacitively coupled to each other with the conductor pattern interposed therebetween. For example, the first element may be disposed at a position overlapped with a first area in the conductor pattern in a plan view of the substrate, and the second element may be disposed at a position overlapped with a second area in the conductor pattern in the plan view of the substrate.

With this configuration, positioning each of the first element and the second element above or below the conductor pattern enables the capacitive coupling between the first element and the second element to be easily achieved.

In a high-frequency module according to a preferred embodiment of the present invention, the conductor pattern is connected to the ground with a conductor interposed therebetween, which includes an inductor component. For example, the conductor including the inductor component may be a via with which the conductor pattern is connected to the ground.

With this configuration, adjusting the positions and the number of the conductors which are provided for the conductor pattern and which include the inductor component enables adjustment of the degree of coupling between the conductor pattern and the ground and the path and the density in the conductor pattern of current flowing from the second element to the ground through the conductor pattern. As a result, the coupling strength and the phase between the first element and the second element are able to be adjusted, thus improving or optimizing the isolation.

In a high-frequency module according to a preferred embodiment of the present invention, the substrate is a multi-layer substrate having a structure in which multiple wiring layers are laminated. The conductor pattern is provided on a wiring layer excluding a top layer and a bottom layer, among the multiple wiring layers. One of the first element and the second element is provided on a wiring layer above the wiring layer on which the conductor pattern is provided, among the multiple wiring layers. The other of the first element and the second element is provided on a wiring layer below the wiring layer on which the conductor pattern is provided, among the multiple wiring layers.

With this configuration, since one of the first element and the second element is provided on the wiring layer above the conductor pattern and the other of the first element and the second element is provided on the wiring layer below the conductor pattern, direct magnetic field coupling between the first element and the second element is reduced or prevented and the first element and the second element are reliably capacitively coupled to each other with the conductor pattern interposed therebetween. In addition, adjusting the state (for example, the shape, the size, or the state of connection with the ground) of the conductor pattern enables the strength of the capacitive coupling between the first element and the second element to be adjusted.

In a high-frequency module according to a preferred embodiment of the present invention, one of the first element and the second element is a chip inductor provided on the top layer, among the multiple wiring layers. With this configuration, since one of the first element and the second element is a chip inductor provided on the outer surface of the substrate, replacing the chip inductor with another one enables the strength of the capacitive coupling between the first element and the second element to be easily adjusted.

In a high-frequency module according to a preferred embodiment of the present invention, the conductor pattern includes a third area including at least one cavity provided therein. With this configuration, since the adjustment of the layout of the cavity provided in the conductor pattern affects the path of current flowing around the cavity to adjust the strength of the capacitive coupling between the first element and the second element, the amplitude and the phase of the signal to cancel the leak signal from the transmission filter are capable of being improved or optimized to realize high isolation.

In a high-frequency module according to a preferred embodiment of the present invention, the third area is provided at a position that is not overlapped with the first area nor the second area in the plan view of the substrate. With this configuration, the first element and the second element are ensured to be opposed to the area excluding the cavity in the conductor pattern. Accordingly, an occurrence of a failure in which the capacitive coupling between the first element and the second element is weakened due to the cavity is reduced or prevented and unnecessary magnetic field coupling between the first element and the second element is reduced or prevented.

In a high-frequency module according to a preferred embodiment of the present invention, the third area is positioned between the first area and the second area in the plan view of the substrate. With this configuration, since the first area and the second area sandwich the third area including the cavity provided in the conductor pattern in the plan view of the substrate, the current flowing between the first area and the second area flows near the cavity and is affected by the cavity. Accordingly, adjusting the layout of the cavity enables the strength of the capacitive coupling between the first element and the second element to be easily adjusted.

In a high-frequency module according to a preferred embodiment of the present invention, multiple cavities may be provided in a mesh pattern in the third area. With this configuration, since the adjustment of the mesh pattern in the third area does not change the outer shape of the conductor pattern, the strength of the capacitive coupling between the first element and the second element is capable of being adjusted with no influence on the wiring pattern around the conductor pattern (without requiring a change of the layout). Furthermore, the effect of reducing or preventing the unnecessary magnetic field coupling between the first element and the second element is increased, as compared to the case in which the third area is defined by one large gap.

In a high-frequency module according to a preferred embodiment of the present invention, the first element is disposed at a position overlapped with an edge portion of the conductor pattern in the plan view of the substrate.

With this configuration, since the first element is coupled to a portion in the conductor pattern at which the density of the current flowing from the second element to the ground through the conductor pattern is high, the strength of the coupling between the first element and the second element is improved.

In a high-frequency module according to a preferred embodiment of the present invention, the first area is positioned between the via and the second area in the plan view of the substrate.

With this configuration, since the first element is positioned at a portion intersecting with the current flowing from the second element to the ground through the conductor pattern in the plan view of the substrate, the coupling between the first element and the second element is improved.

According to preferred embodiments of the present invention, high-frequency modules are provided, each of which includes a transmission filter and a reception filter and which is capable of improving the isolation and easily controlling the attenuation pole.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will herein be described in detail with reference to the drawings. Each preferred embodiment described below indicates a preferred specific example of the present invention. Numerical values, shapes, materials, components, the positions at which the components are disposed, the connection mode of the components, steps, the order of the steps, and other aspects, which are indicated in the preferred embodiments described below, are only examples and are not intended to limit the present invention. Among the components in the preferred embodiments described below, the components that are not described in the independent claims are described as optional components.

Figure 1:
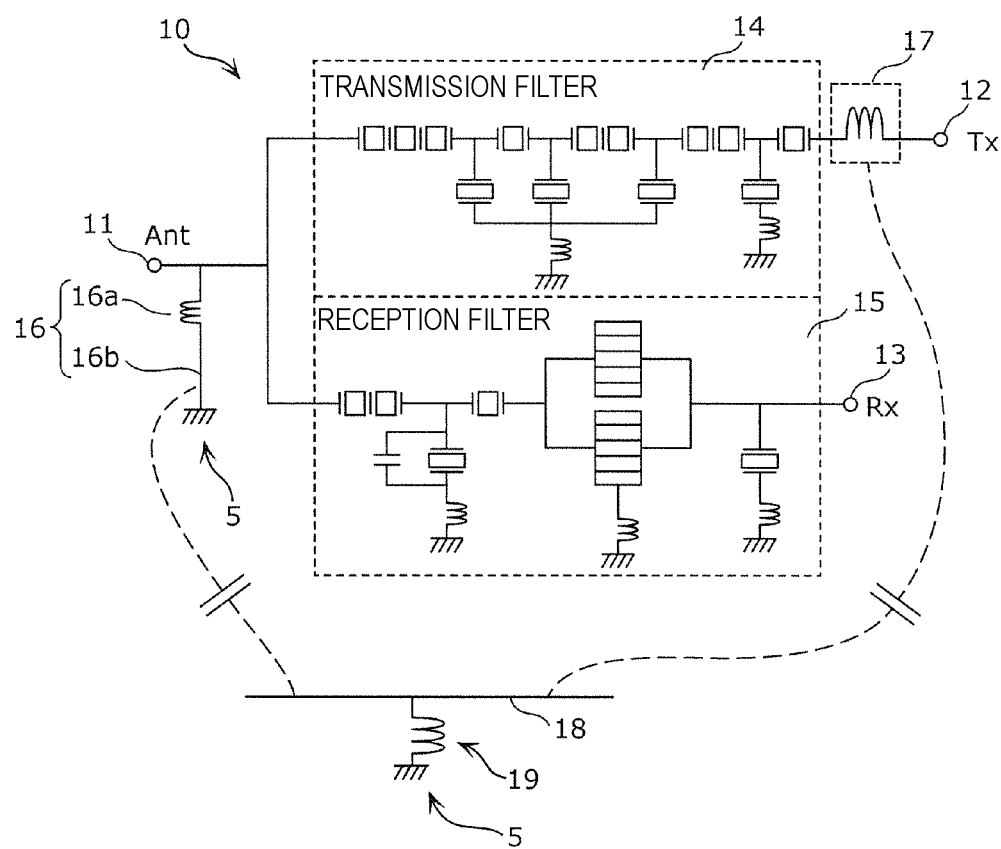
FIG. 1 is a circuit diagram of a high-frequency module according to a preferred embodiment of the present invention.

FIG. 1 is a circuit diagram of a high-frequency module 10 according to a preferred embodiment of the present invention. The high-frequency module 10 performs filtering of signals transmitted and received through an antenna (not illustrated). The high-frequency module 10 includes an antenna (Ant) terminal 11, a transmission (Tx) terminal 12, a reception (Rx) terminal 13, a transmission filter 14, a reception filter 15, a first element 16, a second element 17, a conductor pattern 18, and a via 19. The high-frequency module 10 is preferably a duplexer, for example, mounted on one substrate described below. However, the high-frequency module 10 according to preferred embodiments of the present invention is not limited to the duplexer and may be any module including a transmission filter and a reception filter. The substrate is preferably, for example, a multi-layer substrate including a plurality of insulating layers that are laminated. Specifically, the substrate is preferably, for example, a low temperature co-fired ceramic (LTCC) substrate. A wiring pattern, the terminals (electrodes), and the conductor pattern provided on the substrate are preferably made of, for example, silver, copper, or aluminum.

The antenna terminal 11 is connected to the antenna and is preferably, for example, an electrode provided on the substrate. The antenna terminal 11 is connected to the antenna for transmission and reception with the wiring pattern, a high-frequency switch, or other suitable components interposed therebetween.

The transmission terminal 12 is a terminal through which a signal to be transmitted from the antenna is input and is preferably, for example, an electrode provided on the substrate. The transmission terminal 12 is connected to an output terminal of a power amplifier with the wiring pattern, a high-frequency switch, or other suitable components interposed therebetween.

The reception terminal 13 is a terminal through which a signal received with the antenna is output and is preferably, for example, an electrode provided on the substrate. The reception terminal 13 is connected to an input terminal of a low-noise amplifier with the wiring pattern, a high-frequency switch, or other suitable components interposed therebetween.

The transmission filter 14 is connected between the antenna terminal 11 and the transmission terminal 12 and transmits a signal component in a transmission band in the signal input through the transmission terminal 12. For example, the transmission filter 14 is preferably a ladder surface acoustic wave (SAW) filter including a plurality of series resonators and a plurality of parallel resonators.

The reception filter 15 is connected between the antenna terminal 11 and the reception terminal 13 and transmits a signal component in a reception band in the signal input through the antenna terminal 11. For example, the reception filter 15 is preferably a SAW filter.

Each of the transmission filter 14 and the reception filter 15 is not limited to a SAW filter and may be a filter of another kind (for example, an LC filter, a cavity resonator filter, a helical filter, or a dielectric filter) as long as the filter has characteristics in which the signals in the transmission band and the reception band are transmitted. Each of the transmission filter 14 and the reception filter 15 is a low pass filter, a high pass filter, or a band-pass filter.

The first element 16 is connected between the antenna terminal 11 and the transmission filter 14. For example, the first element 16 is connected between the antenna terminal 11 and a node between the transmission filter 14 and the reception filter 15. For example, the first element 16 is preferably at least one of a line with which the antenna terminal 11 is connected to the transmission filter 14, a first shunt inductor connected between a node between the antenna terminal 11 and the transmission filter 14 and ground 5, a line connected to the first inductor, a first shunt capacitor connected between the node and the ground 5, and a line connected to the first capacitor.

The line connected to the first inductor is preferably, for example, the line connected between the antenna terminal 11 and the transmission filter 14, to which the first shunt inductor is connected, a line connected between the node between the antenna terminal 11 and the transmission filter 14 and the first inductor, or a line connected between the first inductor and the ground 5. The line connected to the first capacitor is preferably, for example, the line connected between the antenna terminal 11 and the transmission filter 14, to which the first shunt capacitor is connected, a line connected between the node between the antenna terminal 11 and the transmission filter 14 and the first capacitor, or a line connected between the first capacitor and the ground 5. In the present preferred embodiment, the first element 16 preferably includes a first shunt inductor 16a, which is connected between the node between the antenna terminal 11 and the transmission filter 14 and the ground 5, and a line 16b with which the first inductor 16a is connected to the ground 5. The first inductor 16a may also define and function as an impedance matching element that matches impedance between the antenna and the high-frequency frequency module 10.

The second element 17 is connected in series between the transmission terminal 12 and the transmission filter 14. For example, the second element 17 is preferably at least one of a line with which the transmission terminal 12 is connected to the transmission filter 14, a second inductor connected between the transmission terminal 12 and the transmission filter 14, a line connected to the second inductor, a second capacitor connected between the transmission terminal 12 and the transmission filter 14, and a line connected to the second capacitor. The line connected to the second inductor is preferably, for example, a line connected between the transmission filter 14 and the second inductor or a line connected between the second inductor and the transmission terminal 12. The line connected to the second capacitor is preferably, for example, a line connected between the transmission filter 14 and the second capacitor or a line connected between the second capacitor and the transmission terminal 12. In the present preferred embodiment, the second element 17 is preferably the second inductor connected between the transmission terminal 12 and the transmission filter 14.

The conductor pattern 18 is provided on the substrate on which the high-frequency module is mounted. For example, the conductor pattern 18 is preferably a solid layer provided on any wiring layer in the multi-layer substrate.

The via 19 is an exemplary conductor including an inductor component connecting the conductor pattern 18 to the ground 5. For example, the via 19 connects the conductor pattern 18 to the ground 5, which are provided on different wiring layers in the multi-layer substrate.

In the high-frequency module 10, the first element 16 is capacitively coupled to the second element 17. In the present preferred embodiment, the first element 16 (the line 16b of the first element 16) is capacitively coupled to the second element 17 with the conductor pattern 18 interposed therebetween, which is connected to the ground 5 by the conductor (the via 19) that includes the inductor component. The conductor pattern 18 may be referred to as a weak ground pattern including a constant inductor component between the conductor pattern 18 and the ground 5.

Figure 2A:
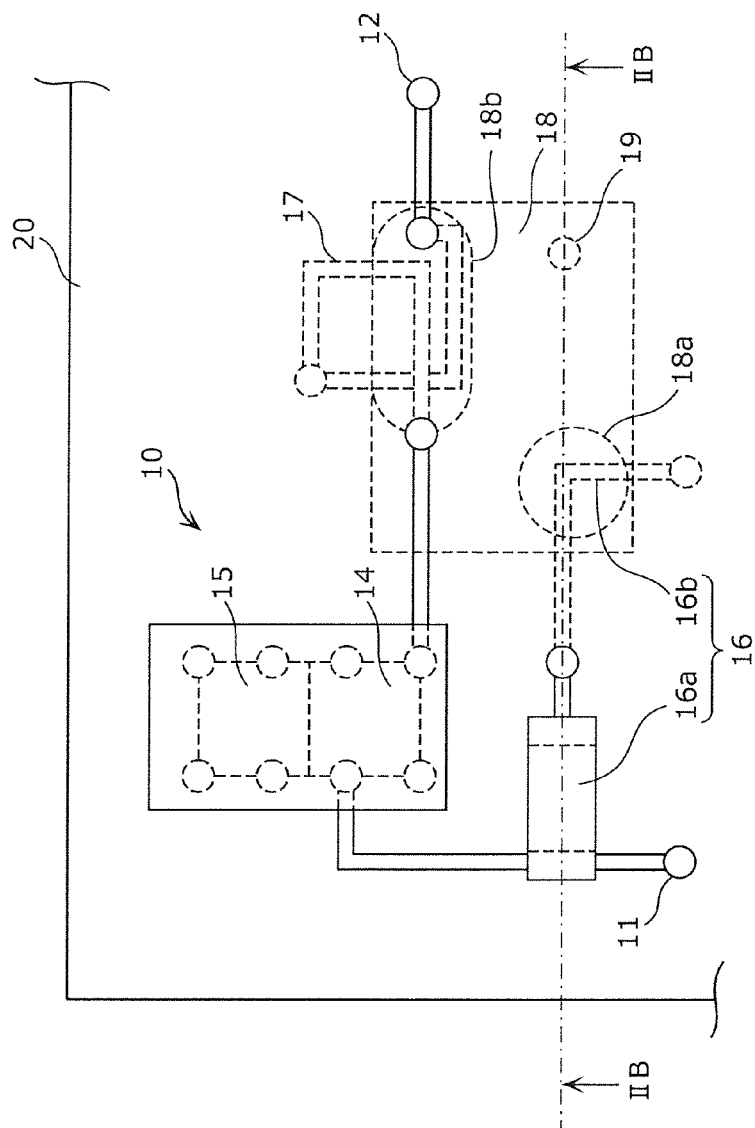
FIG. 2A is a schematic view illustrating an exemplary layout of the high-frequency module illustrated in FIG. 1.

FIG. 2A is a schematic view illustrating an exemplary layout of the high-frequency module 10 illustrated in FIG. 1. The layout of a plan view of the high-frequency module mounted on a multi-layer substrate 20 is illustrated in FIG. 2A. Portions indicated by broken lines are portions hidden by mounted components or portions provided on inner wiring layers or a bottom wiring layer, excluding a top wiring layer, in the multi-layer substrate 20.

As illustrated in FIG. 2A, the transmission filter 14 and the reception filter 15 are preferably provided, for example, as one package component and are mounted on a top surface of the multi-layer substrate 20. The first inductor 16a is a chip component and is mounted on the top surface of the multi-layer substrate 20. The antenna terminal 11 and the transmission terminal 12 are mounted on the top surface of the multi-layer substrate 20 and are connected with other components.

The capacitively coupled elements (the line 16b of the first element 16, the second element 17, and the conductor pattern 18) are provided on the inner wiring layers (different wiring layers) in the multi-layer substrate 20. As illustrated in FIG. 2A, the first element 16 (the line 16b of the first element 16) is disposed at a position overlapped with a first area 18a in the conductor pattern 18 in the plan view of the multi-layer substrate 20, and the second element 17 is disposed at a position overlapped with a second area 18b in the conductor pattern 18 in the plan view of the multi-layer substrate 20. In other words, the first element 16 (the line 16b of the first element 16) and the second element 17 include the areas that overlap with the conductor pattern 18 in the plan view of the multi-layer substrate 20 and are capacitively coupled to each other with the overlapping areas.

Figure 2B:
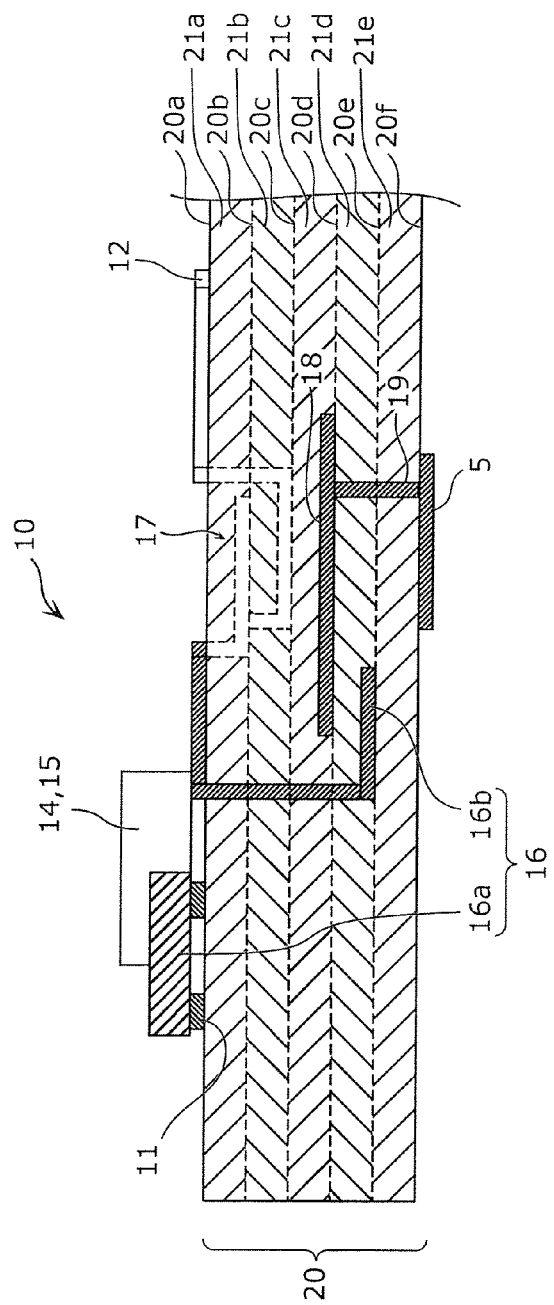
FIG. 2B is a cross-sectional view of the high-frequency module along a plane passing a IIB-IIB line in FIG. 2A.

FIG. 2B is a cross-sectional view of the high-frequency module 10 along a plane passing a IIB-IIB line in FIG. 2A. The second element 17 that is not positioned on the cutting plane through the IIB-IIB line but is provided in the inner wiring layers in the multi-layer substrate 20 is indicated by broken lines in FIG. 2B.

As illustrated in FIG. 2B, the multi-layer substrate 20 includes the wiring layers including a top layer 20a, a second layer 20b, a third layer 20c, a fourth layer 20d, a fifth layer 20e, and a bottom layer 20f from the top layer (the front surface) to the bottom layer (the rear surface). The top layer 20a, the second layer 20b, the third layer 20c, the fourth layer 20d, the fifth layer 20e, and the bottom layer 20f are provided on the top surface of a first insulating layer 21a, the top surface of a second insulating layer 21b, the top surface of a third insulating layer 21c, the top surface of a fourth insulating layer 21d, the top surface of a fifth insulating layer 21e, and the bottom surface of the fifth insulating layer 21e, respectively. The first insulating layer 21a, the second insulating layer 21b, the third insulating layer 21c, the fourth insulating layer 21d, and the fifth insulating layer 21e are laminated structures defining the multi-layer substrate 20 and are insulating substrates having both surfaces which are preferably made of, for example, LTCC, alumina, or glass epoxy, and on which wiring is provided.

The conductor pattern 18 is preferably, for example, a solid layer provided on a partial area of the fourth layer 20d and is connected to the ground 5, which is provided on the bottom layer 20f, with the via 19 interposed therebetween.

The line 16b of the first element 16 is provided at a position on the fifth layer 20e immediately below the conductor pattern 18. The line 16b is connected to the first inductor 16a mounted on the top layer 20a and the ground 5 provided on the bottom layer 20f with vias interposed therebetween.

The second element 17 is an inductor including annular wiring patterns provided on the second layer 20b and the third layer 20c immediately above the conductor pattern 18 and laminated. The terminals on both sides of the second element 17 are connected to the wiring pattern on the top layer 20a with vias interposed therebetween.

As illustrated in FIGS. 2A and 2B, in the high-frequency module 10 in the present preferred embodiment, the first element 16 connected between the antenna terminal 11 and the transmission filter 14 is capacitively coupled to the second element 17 connected in series between the transmission terminal 12 and the transmission filter 14 with the conductor pattern 18 interposed therebetween. Accordingly, since another signal path on which the input terminal and the output terminal of the transmission filter 14 are capacitively coupled to each other is provided in parallel with a signal path of the transmission filter 14 and a leak signal from the transmission filter 14 is cancelled, isolation is improved. Since the second element 17 is not an inductor connected in series to the parallel resonators in the transmission filter 14 and, instead, is the element connected in series between the transmission terminal 12 and the transmission filter 14, the value of the second element 17 is not significantly limited due to the improvement of isolation characteristics. In other words, adjusting the value of the inductor connected in series to the parallel resonators in the transmission filter 14 enables an attenuation pole to be controlled with little influence on ensuring isolation.

The conductor pattern 18 providing the capacitive coupling between the first element 16 and the second element 17 is connected to the ground 5 with the conductor (the via 19) interposed therebetween, which includes the inductor component. Accordingly, adjusting the positions and the number of the vias 19 provided for the conductor pattern 18 enables adjustment of the degree of coupling between the conductor pattern 18 and the ground 5 and the path and the density in the conductor pattern 18 of current flowing from the second element 17 to the ground 5 through the conductor pattern 18. As a result, the coupling strength and the phase between the first element 16 and the second element 17 are able to be adjusted, thus improving or optimizing the isolation.

The multi-layer substrate 20 preferably includes, for example, the plurality of wiring layers (the top layer 20a to the bottom layer 20f) that are laminated to one another, and the conductor pattern 18 is provided on a wiring layer (the fourth layer 20d here) other than the top layer 20a and the bottom layer 20f, among the plurality of wiring layers. One of the first element 16 and the second element 17 (the second element 17 here) is provided on the wiring layers (the second layer 20b and the third layer 20c here) above the wiring layer (the fourth layer 20d here) on which the conductor pattern 18 is provided, among the plurality of wiring layers. The other of the first element 16 and the second element 17 (the line 16b of the first element 16 here) is provided on the wiring layer (the fifth layer 20e here) below the wiring layer (the fourth layer 20d here) on which the conductor pattern 18 is provided, among the multiple wiring layers.

Accordingly, since one of the first element 16 and the second element 17 is provided on the layers above the conductor pattern 18 and the other of the first element 16 and the second element 17 is provided on the layer below the conductor pattern 18, direct magnetic field coupling between the first element 16 and the second element 17 is reduced or prevented, and the first element 16 and the second element 17 are reliably capacitively coupled to each other with the conductor pattern 18 interposed therebetween. In other words, if both of the first element 16 and the second element 17 are provided on one of a layer above the conductor pattern 18 and a layer below the conductor pattern 18 (for example, both of the first element 16 and the second element 17 are provided on the same wiring layer), the magnetic field coupling between the first element 16 and the second element 17 is increased and appropriate capacitive coupling is not ensured. However, the first element 16 and the second element 17 sandwiching the conductor pattern 18 between the first element 16 and the second element 17, as in the present preferred embodiment, reduces or prevents unnecessary magnetic field coupling to ensure the appropriate capacitive coupling.

In addition, adjusting the state (for example, the shape, the size, or the state of connection with the ground) of the conductor pattern 18 enables the strength of the capacitive coupling between the first element 16 and the second element 17 to be adjusted.

Figure 3A:
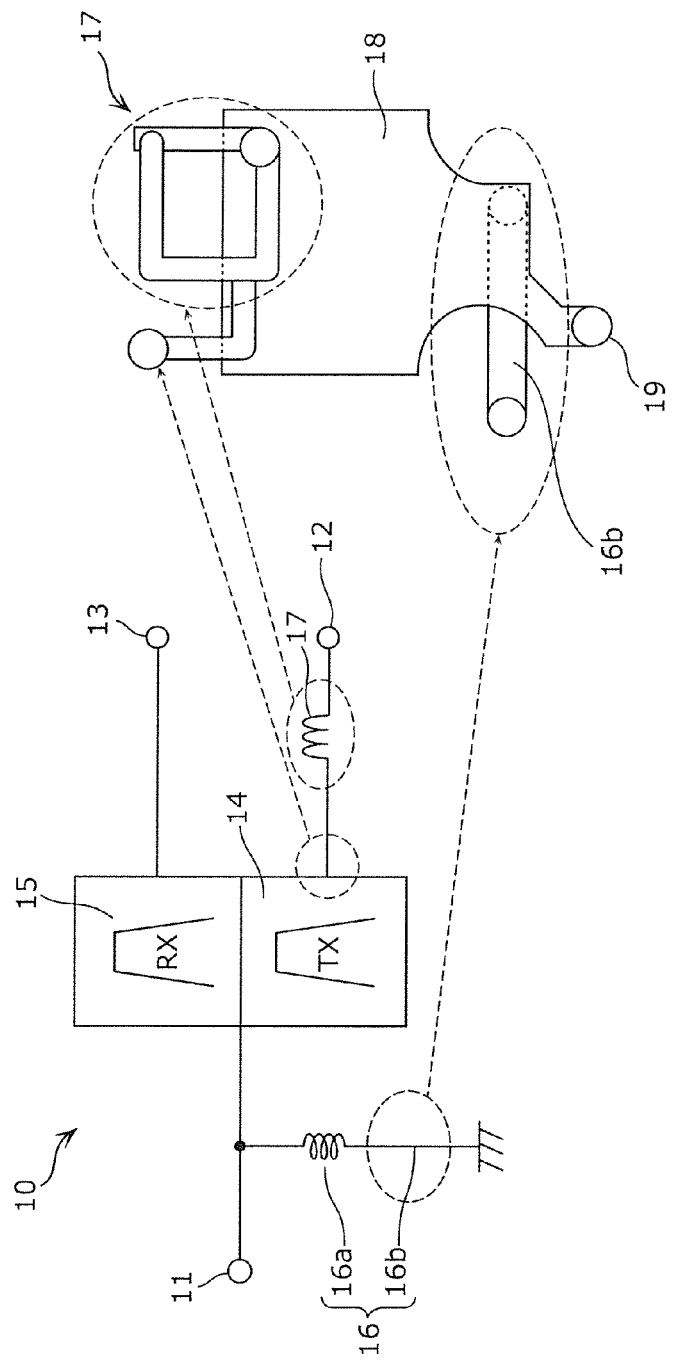
FIG. 3A is a diagram illustrating a specific exemplary layout of capacitively coupled elements illustrated in FIGS. 2A and 2B.

FIG. 3A is a diagram illustrating a specific exemplary layout of the capacitive coupling elements (the line 16b of the first element 16, the second element 17, and the conductor pattern 18) illustrated in FIGS. 2A and 2B. In FIG. 3A, a symbolic diagram of the high-frequency module 10 illustrated in FIG. 1 is provided on the left side, a specific example of the layout of the capacitive coupling elements (the line 16b of the first element 16, the second element 17, and the conductor pattern 18) is provided on the right side, and the correspondence between the portions in the symbolic diagram and the portions in the layout is indicated using broken lines and broken-line circular shapes. A perspective layout of the capacitive coupling elements (the line 16b of the first element 16, the second element 17, and the conductor pattern 18) in the plan view of the multi-layer substrate 20 is illustrated in the layout in FIG. 3A.

Figure 3B:
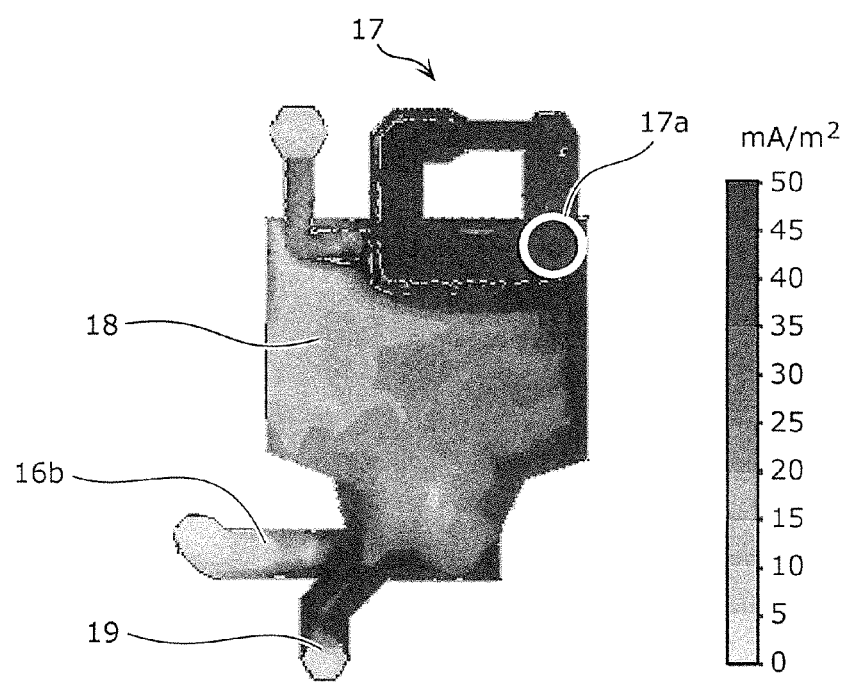
FIG. 3B is a diagram illustrating the distribution of the density of current in the layout illustrated in FIG. 3A.

FIG. 3B is a diagram illustrating the distribution of the density of current in the layout illustrated in FIG. 3A. The distribution of the density ($mA/m^2$) of current flowing through the capacitive coupling elements (the line 16b of the first element 16, the second element 17, and the conductor pattern 18) when high-frequency current is applied to the a terminal 17a of the second element 17 (a terminal of the second element 17 at the side at which the second element 17 is connected to the transmission terminal 12) using the terminal 17a as an excitation point is illustrated in FIG. 3B. The darker portions have the higher current densities in FIG. 3B.

As illustrated in FIG. 3B, the current supplied to the terminal 17a of the second element 17 flows into the via 19 and the line 16b through the conductor pattern 18. Accordingly, the layout illustrated in FIG. 3B indicates that the line 16b of the first element 16 and the second element 17 are capacitively coupled to each other with the conductor pattern 18 interposed therebetween.

In addition, as illustrated in FIG. 3B, the current supplied to the terminal 17a of the second element 17 flows through an edge portion of the conductor pattern 18 with high current density and flows toward the via 19. This indicates that the first area 18a of the conductor pattern 18, overlapped with the first element 16 (the line 16b here), is preferably positioned between the second area 18b of the conductor pattern 18, overlapped with the second element 17, and the via 19 in the plan view of the multi-layer substrate 20. Accordingly, since the first element 16 is positioned at a portion intersecting with the current flowing from the second element 17 to the ground 5 through the conductor pattern 18 in the plan view of the multi-layer substrate 20, the coupling between the first element 16 and the second element 17 is improved.

Figure 4:
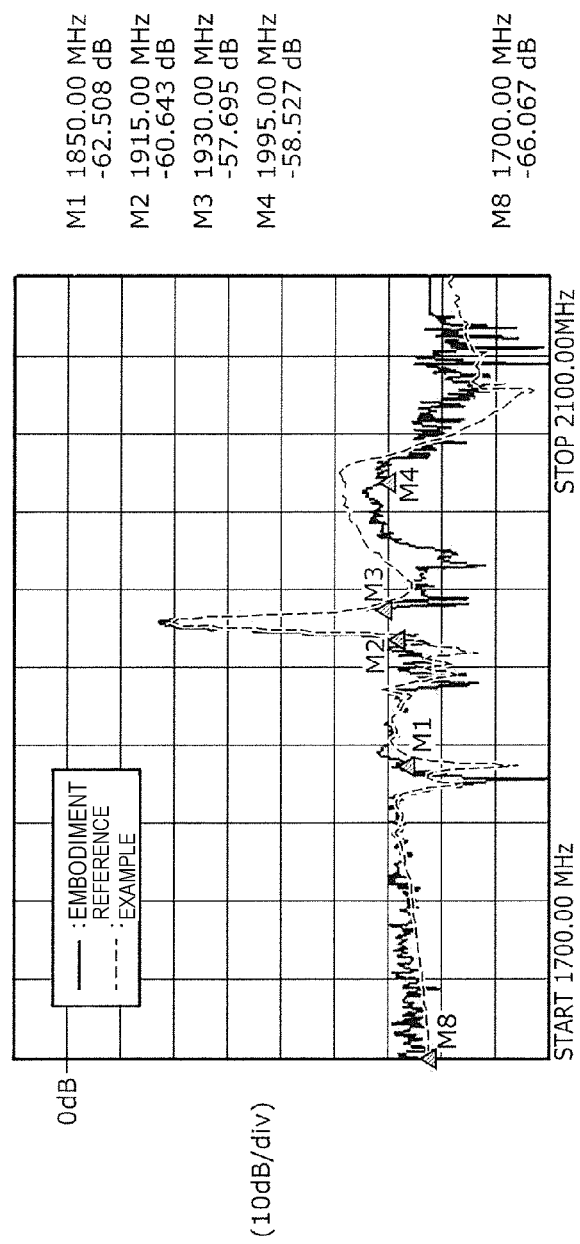
FIG. 4 is a graph illustrating a result of a simulation of isolation characteristics of a high-frequency module according to a preferred embodiment of the present invention, which has the layout illustrated in FIG. 3A.

FIG. 4 is a graph illustrating a result of a simulation of the isolation characteristics of the high-frequency module 10 according to the present preferred embodiment, which has the layout illustrated in FIG. 3A. Isolation characteristics (a broken line) of a high-frequency module as a comparative example, which does not include the capacitive coupling described in the present preferred embodiment, are superposed on the isolation characteristics (a solid line) of the high-frequency module 10 according to the present preferred embodiment for comparison in FIG. 4. The vertical axis represents the isolation, that is, the ratio (suppression ratio) of the strength of the signal observed at the reception terminal 13 to the strength of the signal input through the transmission terminal 12. The horizontal axis represents frequency. The transmission band is indicated on the left side (the low frequency side) of a peak appearing in a central portion and the reception band is indicated on the right side (the high frequency side) thereof. The frequencies and the suppression ratios of five markers (points M1 to M4 and M8 in the graph) in the isolation characteristics of the high-frequency module 10 according to the present preferred embodiment are indicated at the right side of the graph.

As is apparent from the fact that the isolation of the high-frequency module 10 according to the present preferred embodiment is higher than the isolation of the high-frequency module of the comparative example in the reception band in FIG. 4, higher isolation is ensured due to the capacitive coupling between the first element 16 and the second element 17 in the high-frequency module 10 according to the present preferred embodiment, as compared to the high-frequency module of the comparative example, which does not include capacitive coupling.

Figure 5:
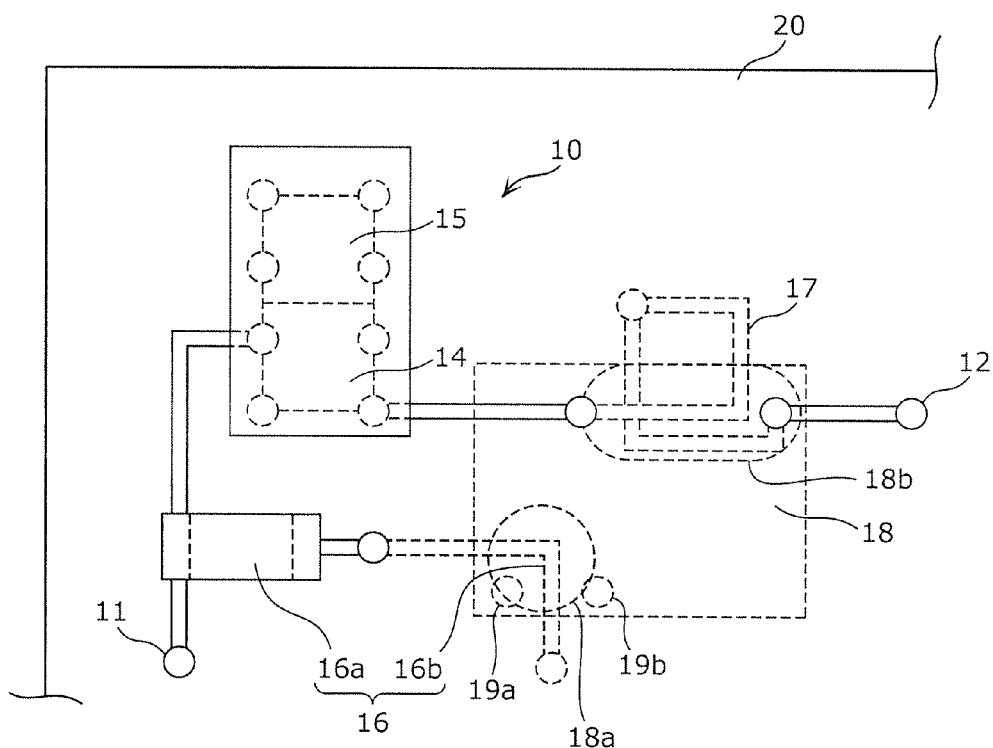
FIG. 5 is a diagram illustrating an example (first modification) of adjustment of the positions and the number of vias of a conductor pattern of a high-frequency module according to a preferred embodiment of the present invention.

FIG. 5 is a diagram illustrating an example (first modification) of an adjustment of the positions and the number of the vias 19 provided for the conductor pattern 18 in a high-frequency module 10 in a preferred embodiment of the present invention.

In the first modification, two vias (a via 19a and a via 19b) are provided, unlike the layout in FIG. 2A in which only one via 19 is provided as the via with which the conductor pattern 18 is connected to the ground 5. The line 16b of the first element 16 extends between the via 19a and the via 19b in the plan view of the multi-layer substrate 20.

The via 19a has the same or substantially the same function as that of the via 19 according to the preferred embodiment illustrated in FIGS. 3A and 3B, that is, causes the first area 18a of the conductor pattern 18 overlapped with the first element 16 (the line 16b here) to be positioned between the second area 18b of the conductor pattern 18 overlapped with the second element 17 and the via 19a in the plan view of the multi-layer substrate 20. Accordingly, since the first element 16 is positioned at a portion intersecting with the current flowing from the second element 17 to the ground 5 through the conductor pattern 18 in the plan view of the multi-layer substrate 20, the coupling between the first element 16 and the second element 17 is improved.

The via 19b is provided to adjust the inductor component between the conductor pattern 18 and the ground 5 (the strength of coupling to the ground) and to adjust the path and the density of the current flowing from the second element 17 to the ground 5 through the conductor pattern 18.

As described above, adjusting the positions and the number of the via 19a and the via 19b provided for the conductor pattern 18 enables the coupling strength and the phase between the first element 16 and the second element 17 to be adjusted in order to cancel the leak signal from the transmission filter 14, thus improving or optimizing the isolation.

Figure 6:
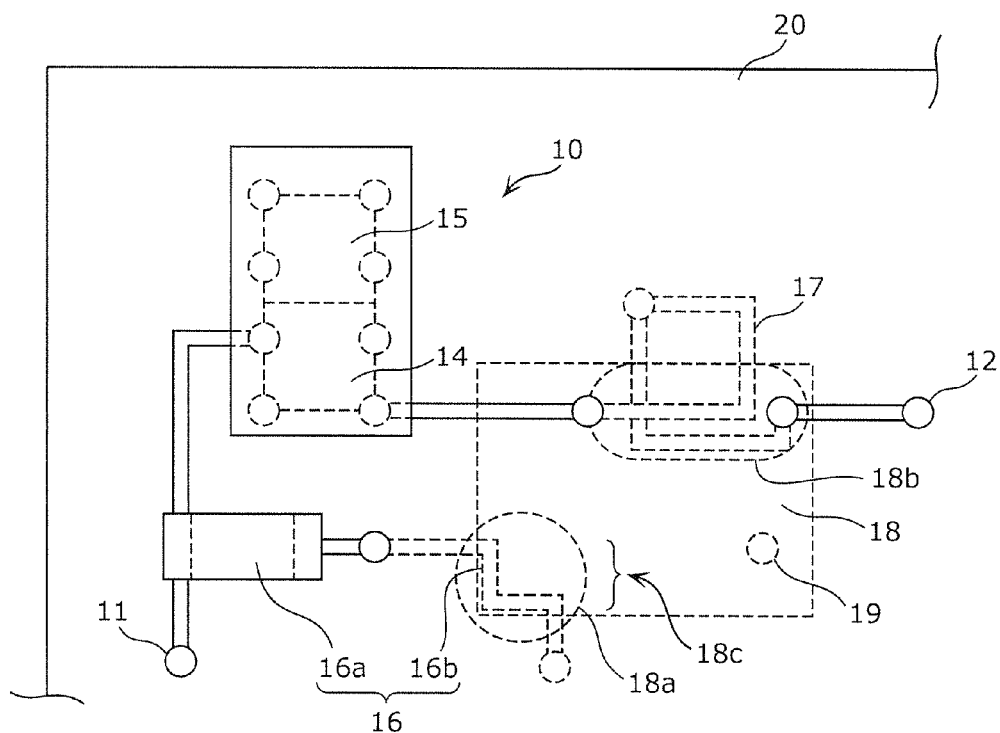
FIG. 6 is a diagram illustrating another example (second modification) of the positional relationship between the conductor pattern and a first element in a high-frequency module according to a preferred embodiment of the present invention.

FIG. 6 is a diagram illustrating another example (second modification) of the positional relationship between the conductor pattern 18 and the first element 16 (, the line 16b of the first element 16) in a high-frequency module 10 according to a preferred embodiment of the present invention.

In the second modification, the first element 16 (the line 16b here) is disposed at a position overlapped with an edge portion 18c of the conductor pattern 18, in the plan view of the multi-layer substrate 20, in the first area 18a of the conductor pattern 18 overlapped with the first element 16 (the line 16b here). More specifically, the line 16b extends so as to bend along one corner of the rectangular or substantially rectangular conductor pattern 18 by approximately 90 degrees in the plan view of the multi-layer substrate 20. The edge portion 18c of the conductor pattern 18 is preferably, for example, a portion closer to an outer edge than to the center of the conductor pattern 18, a portion positioned at the inner side within a predetermined distance from the outer edge of the conductor pattern 18, or a portion closer to the outer edge, at which the density of the current flowing though the conductor pattern 18 is determined in advance to be higher than a predetermined value.

As described above, since disposing the first element 16 (the line 16b here) at a position overlapped with the edge portion 18c of the conductor pattern 18 in the plan view of the multi-layer substrate 20 causes the first element to be coupled to a portion in the conductor pattern at which the density of the current flowing from the second element to the ground through the conductor pattern is high, the strength of the coupling between the first element and the second element is improved.

Figure 7:
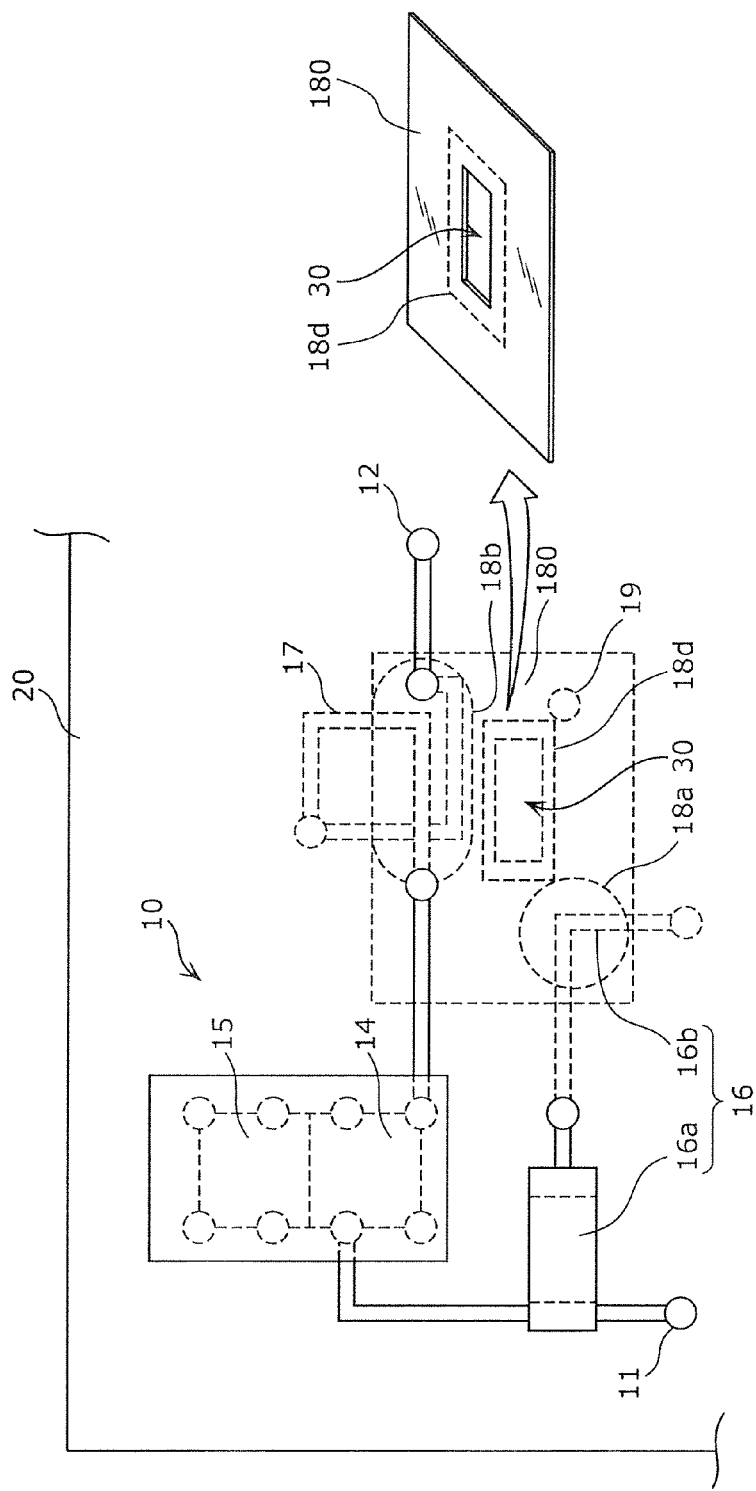
FIG. 7 is a diagram illustrating another example (third modification) of the conductor pattern of a high-frequency module according to a preferred embodiment of the present invention.

FIG. 7 is a diagram illustrating another example (third modification) of the conductor pattern of a high-frequency module 10 according to a preferred embodiment of the present invention.

In the third modification, a conductor pattern 180 includes a third area 18d in which a cavity 30 is provided, as illustrated in FIG. 7. The cavity 30 is a portion in which a portion of the solid layer is cut off (that is, a gap) and is in a state in which the cavity 30 is filled with the upper third insulating layer 21c and/or the lower fourth insulating layer 21d in the multi-layer substrate 20.

Since the adjustment of the layout (for example, the position, the size, and/or the shape) of such a cavity 30 affects the path of current flowing around the cavity 30 to adjust the strength of the capacitive coupling between the first element 16 and the second element 17, the amplitude and the phase of the signal cancelling the leak signal from the transmission filter 14 are capable of being improved or optimized to obtain high isolation.

In the third modification, the third area 18d is provided at a position that is not overlapped with the first area 18a nor with the second area 18b in the plan view of the multi-layer substrate 20. "The third area 18d is not overlapped with the first area 18a nor the second area 18b in the plan view of the multi-layer substrate 20" means that it is sufficient for a portion that is not overlapped with the first element 16 (the line 16b of the first element 16) included in the first area 18a to be provided in the cavity 30 included in the third area 18d and a portion that is not overlapped with the second element 17 included in the second area 18b to be provided in the cavity 30 included in the third area 18d in the plan view of the multi-layer substrate 20. In other words, it is sufficient for at least a portion of the cavity 30 not to be overlapped with the line 16b of the first element 16 nor with the second element 17. However, the entire or substantially the entire cavity 30 is preferably not overlapped with the line 16b of the first element 16 nor with the second element 17, as in the third modification.

As described above, since the third area 18d is not overlapped with the first area 18a nor with the second area 18b in the plan view of the multi-layer substrate 20, the first element 16 (the line 16b of the first element 16) and the second element 17 are ensured to be opposed to the area excluding the cavity 30 in the conductor pattern 18. Accordingly, an occurrence of a failure in which the capacitive coupling between the first element 16 and the second element 17 is weakened because of the cavity 30 is reduced or prevented and the unnecessary magnetic field coupling between the first element and the second element is also reduced or prevented.

In addition, in the third modification, the third area 18d is positioned between the first area 18a and the second area 18b in the plan view of the multi-layer substrate 20. "The third area 18d is positioned between the first area 18a and the second area 18b in the plan view of the multi-layer substrate 20" means that a line segment crossing the cavity 30 included in the third area 18d is included in a line segment connecting an arbitrary portion in the first element 16 (the line 16b of the first element 16) included in the first area 18a to an arbitrary portion in the second element 17 included in the second area 18b in the plan view of the multi-layer substrate 20.

As described above, since positioning the third area 18d between the first area 18a and the second area 18b causes the first area 18a and the second area 18b to sandwich the third area 18d including the cavity 30, the current flowing between the first area 18a and the second area 18b flows near the cavity 30 and is surely affected by the cavity 30. Accordingly, adjusting the layout of the cavity 30 enables the strength of the capacitive coupling between the first element 16 and the second element 17 to be easily adjusted.

Figure 8:
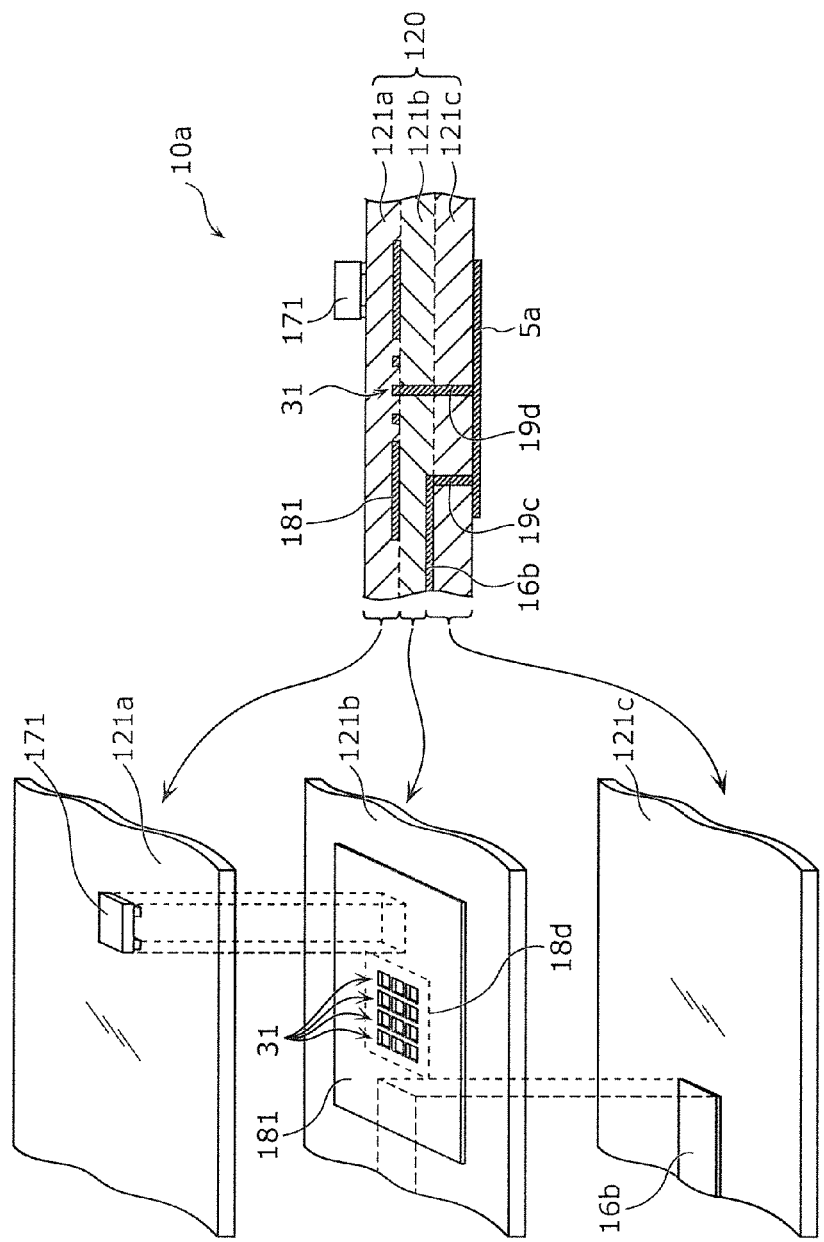
FIG. 8 is a diagram illustrating the structure of a high-frequency module in a modification (fourth modification) according to a preferred embodiment of the present invention.

FIG. 8 is a diagram illustrating the structure of a high-frequency module 10a in a modification (fourth modification) of a preferred embodiment of the present invention. A cross-sectional view and a perspective view of the capacitive coupling elements (the line 16b of the first element 16, a chip inductor 171 defining the second element, and a conductor pattern 181) in a multi-layer substrate 120, in the high-frequency module 10a, are illustrated in FIG. 8. The high-frequency module 10a in the fourth modification differs from the high-frequency module 10 in the preferred embodiment described above in that (1) the multi-layer substrate 120 includes three insulating layers (a first insulating layer 121a to a third insulating layer 121c), (2) a plurality of cavities 31 are provided in a mesh pattern in the third area 18d in the conductor pattern 18, and (3) the chip inductor 171 is used as the second element. The remaining configuration is the same or substantially the same as that of the high-frequency module 10 in the preferred embodiment described above. Points different from the high-frequency module 10 in the preferred embodiment described above will be described.

In the fourth modification, the multi-layer substrate 120 includes the three insulating layers (the first insulating layer 121a to the third insulating layer 121c).

In addition, one of the first element and the second element (the chip inductor 171 defining the second element here) is provided on the top wiring layer (that is, on the first insulating layer 121a). Accordingly, replacing the chip inductor 171 with another one enables the strength of the capacitive coupling between the first element and the second element to be easily adjusted.

Furthermore, the conductor pattern 181 is provided on the second insulating layer 121b and the plurality of cavities 31 are provided in a mesh pattern in the third area 18d positioned at a central portion of the conductor pattern 181. Although the plurality of cavities 31 preferably include sixteen cavities 31, for example, arranged in a grid pattern in the fourth modification, the plurality of cavities 31 are not limited to the shape and number described above. It is sufficient for the plurality of cavities 31 to include the cavities of an arbitrary shape and an arbitrary number to provide the capacitive coupling appropriate to cancel out the leak signal from the transmission filter 14.

As described above, since the adjustment of the mesh state in the third area 18d does not change the outer shape of the conductor pattern 181 in the fourth modification, the strength of the capacitive coupling between the first element 16 the line 16b of the first element 16) and the chip inductor 171 defining the second element is capable of being adjusted with no influence on the wiring pattern around the conductor pattern 181 (without requiring a change of the layout). Furthermore, the effect of reducing or preventing the unnecessary magnetic field coupling between the first element 16 and the second element (the chip inductor 171) is increased, as compared to the case in which the third area 18d includes one large gap.

In the fourth modification, the conductor pattern 181 is connected to ground 5a provided on the bottom surface of the third insulating layer 121c with a via 19d interposed therebetween, which is connected to the mesh conductor partitioning the cavities 31. The line 16b of the first element 16 is connected to the ground 5a with a via 19c interposed therebetween.

Although high-frequency modules of the present invention are described based on preferred embodiments and modifications thereof, the present invention is not limited to these preferred embodiments and modifications. Various modifications of the preferred embodiments and the modifications, which are conceived by persons skilled in the art, and other configurations provided by combining portion of the components in the preferred embodiments and the modifications are also included within the range of the present invention without departing from the spirit and scope the present invention.

For example, although the first capacitive coupling element 16 is preferably only the line 16b of the first element 16 in the preferred embodiments and modifications described above, the first element 16 is not limited to this and may be an arbitrary element as long as the element is connected between the antenna terminal 11 and the transmission filter 14. Specifically, the first capacitive coupling element may be at least one of a line with which the antenna terminal 11 is connected to the transmission filter 14, a first shunt inductor connected between the node between the antenna terminal 11 and the transmission filter 14 and the ground 5, a line connected to the first inductor, a first shunt capacitor connected between the node and the ground 5, and a line connected to the first capacitor, for example. It is sufficient for an element capable of cancelling the leak signal from the transmission filter 14 by a predetermined amount or more to be appropriately selected through simulation or other method as the first capacitive coupling element.

Similarly, although the second capacitive coupling element 17 is preferably the inductor in the preferred embodiments and modifications described above, the second capacitive coupling element 17 is not limited to this and may be an arbitrary element as long as the element is connected in series between the transmission terminal 12 and the transmission filter 14. Specifically, the second capacitive coupling element may be at least one of a line with which the transmission terminal 12 is connected to the transmission filter 14, a second inductor connected between the transmission terminal 12 and the transmission filter 14, a line connected to the second inductor, a second capacitor connected between the transmission terminal 12 and the transmission filter 14, and a line connected to the second capacitor. It is sufficient for an element capable of cancelling the leak signal from the transmission filter 14 by a predetermined amount or more to be appropriately selected through simulation or other method as the second capacitive coupling element.

In addition, although the inductor defining the second element 17 preferably has the laminated structure including the plurality of wiring layers of the multi-layer substrate 20 in the preferred embodiments and modification described above, the inductor defining the second element 17 is not limited to such a structure. The inductor defining the second element 17 may include one wiring layer or may be a chip component mounted on the top layer 20a.

Furthermore, although the antenna terminal 11 is preferably one antenna terminal in the preferred embodiments and modifications described above, the antenna terminal 11 may include a plurality of terminals to be connected to a respective plurality of antennas.

Furthermore, although the first element 16 and the second element 17 are preferably capacitively coupled to each other with the conductor pattern 18 interposed therebetween in the preferred embodiments and modifications described above, the first element 16 may be directly capacitively coupled to the second element 17 without the conductor pattern 18 interposed therebetween. For example, the first element 16 and the second element 17 may oppose different wiring layers in the multi-layer substrate 20 to achieve direct capacitive coupling between the first element 16 and the second element 17.

Furthermore, although the capacitive coupling elements (the line 16b of the first element 16, the second element 17, and the conductor pattern 18) are preferably provided on the different wiring layers of the multi-layer substrate 20 in the order of the second element 17, the conductor pattern 18, and the line 16b from the top to the bottom in the preferred embodiments and modifications described above, the capacitive coupling elements are not limited to such a structure. The capacitive coupling elements may be provided in the opposite order. Alternatively, the first element 16 and the second element 17 may be provided on the same wiring layer and the conductor pattern 18 may be provided on a wiring layer different from the wiring layer on which the first element 16 and the second element 17 are provided.

Furthermore, although the conductor pattern 18 preferably has a rectangular or substantially rectangular shape in the plan view of the multi-layer substrate 20 in the preferred embodiments and modifications described above, the conductor pattern 18 is not limited to such a shape. The conductor pattern 18 may have an arbitrary shape, such as a circle, a strip shape, or a branched wiring pattern, for example. The conductor pattern 18 may have a shape appropriate for the capacitive coupling between the first element 16 and the second element 17 through simulation or other method.

Furthermore, although the transmission filter 14 and the reception filter 15 are preferably provided as one package component in the preferred embodiments and modifications described above, the transmission filter 14 and the reception filter 15 are not limited to such a configuration and may be separate circuits.

Furthermore, although the high-frequency module 10 preferably includes the multi-layer substrate 20 in the preferred embodiments and modifications described above, the high-frequency module 10 may include a single-layer substrate. In this case, a package component and a chip component may be mounted on the surface of the single-layer substrate and the first element and the second element may be capacitively coupled to each other using a front-surface wiring layer and a rear-surface wiring layer of the single-layer substrate.

Preferred embodiments of the present invention are usable for, for example, duplexers each including a SAW filter as the high-frequency module that performs filtering of signals transmitted and received through an antenna, in particular, as the high-frequency module capable of improving the isolation and easily controlling the attenuation pole.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
an antenna terminal;
a transmission terminal;
a reception terminal;
a reception filter connected between the antenna terminal and the reception terminal;
a transmission filter connected between the antenna terminal and the transmission terminal;
a substrate on which the reception filter and the transmission filter are mounted;
a first element connected between the antenna terminal and the transmission filter; and
a second element connected in series between the transmission terminal and the transmission filter; wherein
the first element and the second element are capacitively coupled to each other;
a conductor pattern is provided on the substrate;
the first element and the second element are capacitively coupled to each other with the conductor pattern interposed therebetween;
the first element is disposed at a position overlapped with a first area in the conductor pattern in a plan view of the substrate; and
the second element is disposed at a position overlapped with a second area in the conductor pattern in the plan view of the substrate.
2. The high-frequency module according to claim 1, wherein
the first element is at least one of a line with which the antenna terminal is connected to the transmission filter, a first inductor connected between a node between the antenna terminal and the transmission filter and ground, a line connected to the first inductor, a first capacitor connected between the node and the ground, and a line connected to the first capacitor; and
the second element is at least one of a line with which the transmission terminal is connected to the transmission filter, a second inductor connected between the transmission terminal and the transmission filter, a line connected to the second inductor, a second capacitor connected between the transmission terminal and the transmission filter, and a line connected to the second capacitor.

3. The high-frequency module according to claim 2, wherein
the first element is the line connected to the first inductor, wherein the line connects the first inductor to the ground; and
the second element is the second inductor.

4. The high-frequency module according to claim 1, wherein the conductor pattern is connected to a ground with a conductor interposed therebetween, which includes an inductor component.

5. The high-frequency module according to claim 4, wherein the conductor including the inductor component is a via with which the conductor pattern is connected to the ground.

6. The high-frequency module according to claim 5, wherein the first element is disposed at a position overlapped with an edge portion of the conductor pattern in the plan view of the substrate.

7. The high-frequency module according to claim 6, wherein the first area is positioned between the via and the second area in the plan view of the substrate.

8. The high-frequency module according to claim 4, wherein
the substrate is a multi-layer substrate including a plurality of wiring layers that are laminated;
the conductor pattern is provided on a wiring layer excluding a top layer and a bottom layer, among the plurality of wiring layers;
one of the first element and the second element is provided on a wiring layer above the wiring layer on which the conductor pattern is provided, among the plurality of wiring layers; and
the other of the first element and the second element is provided on a wiring layer below the wiring layer on which the conductor pattern is provided, among the plurality of wiring layers.

9. The high-frequency module according to claim 8, wherein one of the first element and the second element is a chip inductor provided on the top layer, among the plurality of wiring layers.

10. The high-frequency module according to claim 8, wherein the conductor pattern includes a third area including at least one cavity provided therein.

11. The high-frequency module according to claim 10, wherein the third area is provided at a position that is not overlapped with the first area nor the second area in the plan view of the substrate.

12. The high-frequency module according to claim 10, wherein the third area is positioned between the first area and the second area in the plan view of the substrate.

13. The high-frequency module according to claim 10, wherein a plurality of the cavities are provided in a mesh pattern in the third area.

14. The high-frequency module according to claim 1, wherein the transmission filter is a ladder surface acoustic wave filter including a plurality of series resonators and a plurality of parallel resonators.

15. The high-frequency module according to claim 1, wherein the reception filter is a surface acoustic wave filter.

16. The high-frequency module according to claim 1, wherein the high-frequency module is a duplexer.

17. The high-frequency module according to claim 1, wherein the substrate is a low temperature co-fired ceramic substrate.

18. The high-frequency module according to claim 1, wherein the conductor pattern is made of silver, copper, or aluminum.

* * * * *